US012754226B2

(12) United States Patent
Miyamoto et al.

(10) Patent No.: US 12,754,226 B2
(45) Date of Patent: Oct. 6, 2026

(54) ARCING DETECTION SYSTEM

(71) Applicant: NITTO KOGYO CORPORATION, Nagakute (JP)

(72) Inventors: Atsushi Miyamoto, Nagakute (JP); Hiyori Ueki, Nagakute (JP)

(73) Assignee: NITTO KOGYO CORPORATION, Nagakute (JP)

( * ) Notice: Subject to any disclaimer, the term of this patent is extended or adjusted under 35 U.S.C. 154(b) by 152 days.

(21) Appl. No.: 18/918,190

(22) Filed: Oct. 17, 2024

(65) Prior Publication Data

US 2025/0044340 A1 Feb. 6, 2025

Related U.S. Application Data

(63) Continuation of application No. PCT/JP2023/014864, filed on Apr. 12, 2023.

(30) Foreign Application Priority Data

May 23, 2022 (JP) ................................ 2022-083656

(51) Int. Cl.
*H01H 31/02* (2006.01)
*G01R 31/14* (2006.01)

(52) U.S. Cl.
CPC .................................. *G01R 31/14* (2013.01)

(58) Field of Classification Search
CPC ........ G01R 31/00; G01R 31/12; G01R 31/14; G01R 31/52; G01R 31/1227; G01R 31/1209; G01R 31/1218; G01R 31/1272; G01R 31/1245; G01R 31/1254; G01R 31/1263; G01R 31/081; G01R 31/083; G01R 31/58; G01R 31/62; H02H 1/0015; H02H 1/04
See application file for complete search history.

(56) References Cited

U.S. PATENT DOCUMENTS 6,445,189 B1 * 9/2002 Pakonen ................ G01R 31/50 324/536
11,237,201 B2 * 2/2022 Kim ...................... H02J 50/001
2004/0066593 A1 * 4/2004 Kolker .................. G01R 31/52 361/42

(Continued)

FOREIGN PATENT DOCUMENTS

JP 2019-184480 A 10/2019
JP 2020-134231 A 8/2020

*Primary Examiner* — Thang X Le

(74) *Attorney, Agent, or Firm* — Muncy, Geissler, Olds & Lowe, P.C.

(57) ABSTRACT

An arcing detection system that detects an output of noise superimposed on a voltage or a current of an electric circuit to which a load is connected, including a filter unit that extracts an output waveform in a high frequency band, and a phase division unit that determines a peak time domain including domains before and after a peak at a commercial frequency related to the output waveform extracted by the filter unit and a 0 value time domain before and after an output at the commercial frequency becomes a 0 value to distinguish between the peak time domain and the 0 value time domain. A determination unit determines an arcing event when an output in the peak time domain or a calculation value of the output in the peak time domain and an output in a 0 value time domain exceeds a threshold.

9 Claims, 12 Drawing Sheets

LOAD (FLUORESCENT LAMP, OR THE LIKE)

(56) References Cited

U.S. PATENT DOCUMENTS

| | | | | |
|---|---|---|---|---|
| 2008/0204949 | A1* | 8/2008 | Zhou .................... | H02H 1/0015 361/42 |
| 2021/0035750 | A1 | 2/2021 | Miyamoto et al. | |

* cited by examiner

ARCING DETECTION SYSTEM

TECHNICAL FIELD

The present invention relates to an arcing detection system.

BACKGROUND ART

As described in Patent Literatures 1 and 2, it is known to extract high-frequency arcing noise superimposed on a commercial frequency using a current sensor or a voltage sensor. For example, in a method for detecting noise of a normal arcing event, noise is superimposed on a peak value of a commercial frequency in a voltage waveform, and the superimposed noise is detected to determine that an arcing event has occurred.

More specifically, using an arcing detection unit 100 as illustrated in FIG. 11, a noise output in a high frequency band is extracted by a high-pass filter 111, and the noise output in the extracted high frequency band is amplified by an amplifier 112. Thereafter, a smoothing unit 113 performs processing so as to follow the flow of change in the amplified noise waveform. The smoothing processing is performed because the waveform amplified by the amplification unit 112 has a form in which 0 and 1 are repeated when seen in detail. Processing is performed to connect respective waveforms that cannot be accurately determined by smoothing processing so that 1 continues (see FIG. 12). Data after this processing is performed is used for determination. Note that, for example, a microcomputer is used as a determination unit 115 that performs the determination. Normally, when the noise level exceeds the threshold for a certain period of time or more, the determination unit 115 determines that it is arcing.

CITATIONS LIST

Patent Literature

Patent Literature 1: JP 2019-184480 A
Patent Literature 2: JP 2020-134231 A

By the way, when a specific type of electric drill, hand mixer, or the like is used, noise is always superimposed. In this case, even in a case where the processing in the filter, the amplification processing, and the smoothing processing are performed, the waveform to be determined becomes a waveform similar to that when the arcing event occurs (see FIG. 13). Therefore, even though no arcing event has occurred, it may be determined as an arcing event. In addition, conventionally, when a difference between a noise output (A domain) for a predetermined time required for the peak of the commercial waveform and a noise output (B domain) for a predetermined time at a zero cross point is equal to or larger than the first threshold, it is determined as noise of the arcing event. However, depending on the electric device, there is a case where a large amount of noise caused by the electric device is output in the domain A and a small amount of noise is output in the domain B. In this case, when the difference between the domain A and the domain B is calculated, it may be determined that the arcing event exceeds the first threshold. Note that originally, noise of an arcing event does not overlap in the domain B. That is, the occurrence of noise in the domain B indicates that an abnormal state is caused by a cause different from the arcing event.

SUMMARY OF INVENTION

Technical Problems

The inventors of the present application have intensively studied this point to attempt to solve the problem. The problem to be solved by the present invention is to improve accuracy of detection of an arcing event.

Solutions to Problems

In order to solve the above problem, there is provided an arcing detection system that detects an output of noise superimposed on a voltage or a current of an electric circuit to which a load is connected, the arcing detection system including a filter unit that extracts an output waveform in a high frequency band, a phase division unit that determines a peak time domain including domains before and after a peak at a commercial frequency related to the output waveform extracted by the filter unit and a 0 value time domain before and after an output at the commercial frequency becomes a 0 value to distinguish between the peak time domain and the 0 value time domain, a determination unit that determines an arcing event when an output in the peak time domain or a calculation value of the output in the peak time domain and an output in a 0 value time domain exceeds a threshold, and a threshold changing unit that changes the threshold depending on presence or absence of an output in the 0 value time domain.

In addition, the threshold changing unit is preferably configured to set a first threshold as a threshold for determining an arcing event when there is no output in the 0 value time domain, and set a second threshold that is a value higher than the first threshold as a threshold for determining an arcing event when an output in the 0 value time domain is recognized.

In addition, the second threshold is preferably a value derived by adding or multiplying an output value in the 0 value time domain to or by the first threshold.

In addition, it is preferable that the second threshold is set to a value derived by adding or multiplying the first threshold by a value derived by adding or multiplying to or by an output value in the 0 value time domain, or a value derived by further multiplying or subtracting a value derived by adding or multiplying an output value in the 0 value time domain to or by the first threshold.

In addition, it is preferable that the second threshold is set to a value derived by adding or multiplying the first threshold by a value derived by adding or multiplying a specific value, or a value derived by further multiplying or subtracting a value derived by adding or multiplying the specific value to or by the first threshold.

In addition, it is preferable that it is capable of determining an arcing event when an output value exceeding the second threshold continues a predetermined number of times or a predetermined time.

Advantageous Effects of Invention

In the present invention, it is possible to improve accuracy of detection of an arcing event.

DESCRIPTION OF EMBODIMENTS

Figure 1:
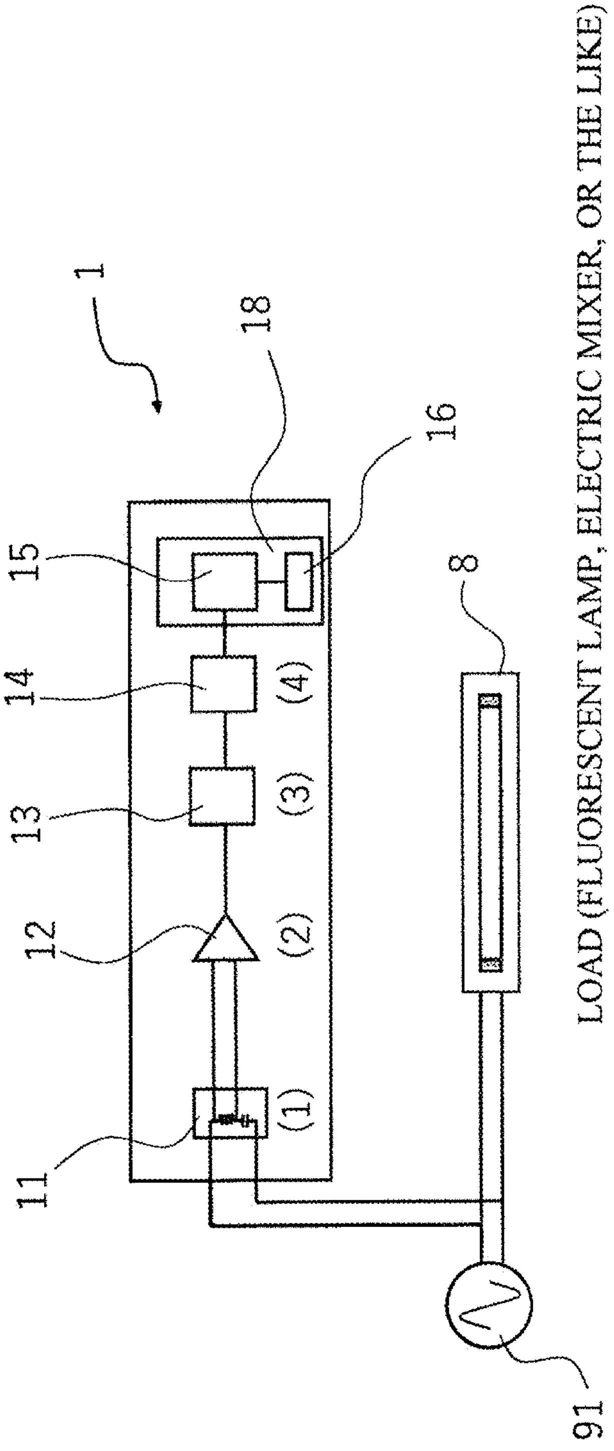
FIG. 1 is a diagram illustrating a relationship among a commercial power source, an arcing detection unit, and a load in an embodiment. Note that (1) to (4) represent portions where processing of (1) to (4) in FIG. 5 is performed.

Hereinafter, modes for carrying out the invention will be described. An arcing detection system according to the present embodiment is an arcing detection system that detects an output of noise superimposed on a voltage or a current of an electric circuit to which a load 8 is connected, the arcing detection system including a filter unit 11 that extracts an output waveform in a high frequency band, a phase division unit 14 that determines a peak time domain including domains before and after a peak at a commercial frequency related to an output waveform extracted by the filter unit 11 and a 0 value time domain before and after an output at the commercial frequency becomes a 0 value to distinguish between the peak time domain and the 0 value time domain, a determination unit 15 that determines an arcing event when an output in the peak time domain or a calculation value of an output in the peak time domain and an output in the 0 value time domain exceeds a threshold, and a threshold changing unit 16 that changes the threshold depending on presence or absence of the output in the 0 value time domain. Therefore, the detection accuracy of the arcing event can be enhanced.

The value set by the threshold value changing unit 16 may be freely changeable depending on the output value in the 0 value time domain. Note that the threshold changing unit 16 is preferably configured to set a first threshold as a threshold for determining an arcing event when there is no output in the 0 value time domain, and sets a second threshold that is a value higher than the first threshold as a threshold for determining an arcing event when an output in the 0 value time domain is recognized.

Here, an outline of the arcing detection unit 1 used in the arcing detection system of the embodiment will be described. As illustrated in FIG. 1, the arcing detection unit 1 is connected between a commercial power source 91 and a load 8, the arcing detection unit 1 of the embodiment includes a filter unit 11 that passes noise in a high frequency band and does not pass noise in a commercial frequency band and a low frequency band, an amplification unit 12 that amplifies a high frequency having passed through the filter unit 11, a smoothing unit 13 that performs preprocessing for determination on a result amplified by the amplification unit 12, a phase division unit 14 that specifies a timing at which noise occurs, a determination unit 15 that performs various determinations, and a threshold changing unit 16 that can change a threshold for determining an arcing event. Note that, although the calculation unit 18 also serves as the determination unit 15 in the example illustrated in FIG. 1 and the like, one component may be configured to serve as the calculation unit 18 and the determination unit 15, or the calculation unit 18 and the determination unit 15 may be configured as separate components.

A value that has passed through the filter unit 11 is amplified several times by an amplification unit that is the amplification unit 12. Furthermore, the smoothing unit 13 that performs peak holding on the amplified value performs processing. The signal processed by the smoothing unit 13 is sent to the phase division unit 14, and is appropriately positioned. Thereafter, the determination unit 15 determines whether or not an arcing event has occurred on the basis of the relationship between a value in a domain allocated by the phase division unit 14 and the threshold. Necessary output is performed according to the result of the determination performed by the determination unit 15. Note that, in the present embodiment, the determination is made using the information processed by the smoothing unit 13, but the determination unit 15 may make the determination without smoothing the information by the smoothing unit 13. In addition, after amplification by the amplification unit 12, allocation may be performed for each domain by the phase division unit 14, and then smoothing may be performed for each domain by the smoothing unit 13.

The smoothing unit 13 of the embodiment performs processing for preventing the determination result from being affected by the fluctuation of the value occurring within an extremely short predetermined time. More specifically, the waveform is processed so that peak values generated at very close times are connected by a gentle straight line or curve. Here, the extremely close time is a time considerably shorter than one cycle (=1/frequency) of a wave to be measured, such as a voltage wave.

Here, how noise is superimposed in a case where a specific hand mixer, an electric drill, or the like is used will be described. Hand mixers, electric drills and the like continuously affect the waveform during use. Therefore, when processing is performed by the smoothing unit 13, the period of use of the specific device may always exceed the threshold. This is completely different from a situation observed when an arcing event such as tracking, disconnection of a cable, or short circuit occurs.

Next, how noise is superimposed in a case where an arcing event occurs will be described. When an arcing event such as tracking, disconnection of a cable, or short circuit occurs, there is a large influence near the peak of the waveform, but there is not so much influence near a 0 point where the output at the commercial frequency is 0 value.

Figure 2:
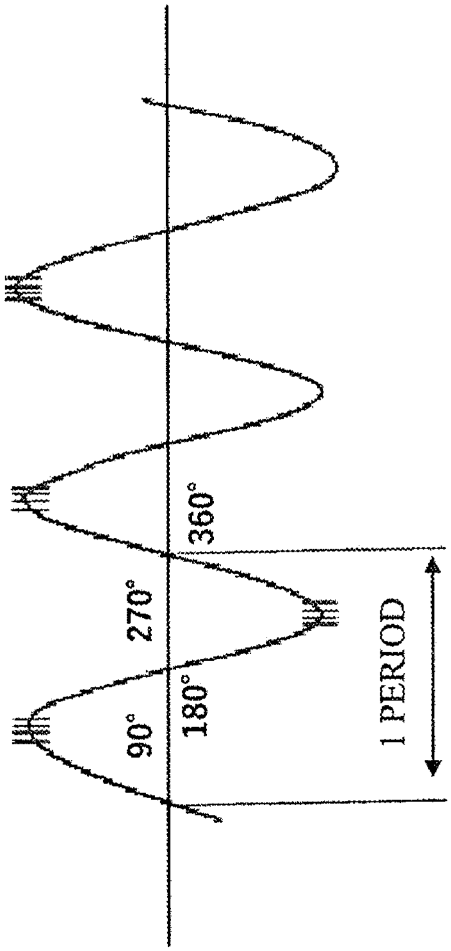
FIG. 2 is a conceptual diagram illustrating that noise is superimposed on a peak at a commercial frequency due to occurrence of an arcing event.

More specifically, as understood from FIG. 2, in a case where an arcing event such as tracking, disconnection of a cable, or short circuit occurs, noise largely appears near a peak of a voltage value or the like. That is, when one cycle is set to 360 degrees, the angle largely appears around 90° and around 270°. In terms of time, in the case of a frequency of 60 Hz, one cycle is 1/60s, that is, 16.7 ms, and thus, in a case where an arcing event such as tracking, disconnection of a cable, or short circuit occurs, the noise output increases near the point where 4.2 ms or 12.5 m elapses after the output at the commercial frequency becomes 0 value.

On the other hand, in a portion where the output at the commercial frequency is 0 value (a portion intersecting 0 point such as 180° or 360°, noise output in a case where an arcing event such as tracking, disconnection of a cable, or short circuit occurs becomes small. Therefore, the occurrence of the arcing event can be accurately grasped by detecting the difference between the output near the peak of the voltage value or the like, that is, the output around 90° or around 270° and the output near the intersection with the 0 point.

Figure 3:
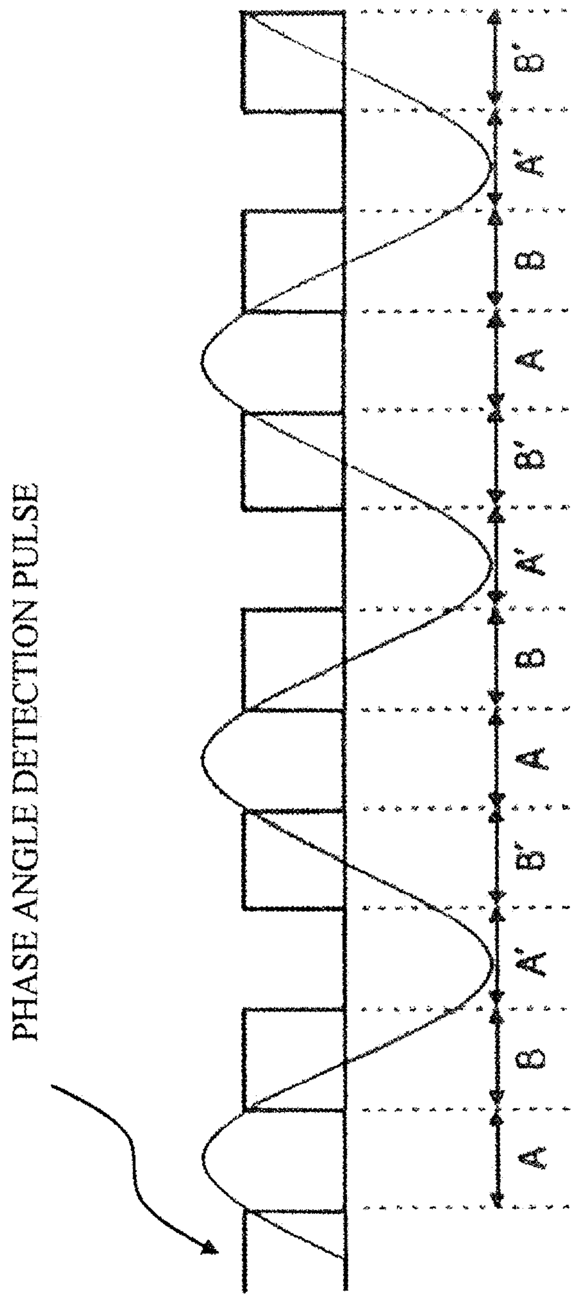
FIG. 3 is a diagram illustrating an example of a relationship between an output timing of a phase angle detection pulse and a peak of a commercial frequency.

In order to implement such a configuration, one period of the voltage waveform information is divided into a plurality of domains. For example, as illustrated in FIG. 3, it is divided into four. In the example illustrated in FIG. 3, the domain of A has a phase angle of 45 degrees or more and less than 135 degrees, the domain of B has a phase angle of 135 degrees or more and less than 225 degrees, the domain of A' has a phase angle of 225 degrees or more and less than 315 degrees, and the domain of B' has a phase angle of 315 degrees or more and less than 405 degrees. Here, the domains divided by angles are specified, but domains can be specified by other elements such as time.

The width of this domain may be set to be narrower or the like. Therefore, the phase division unit 14 is preferably configured to be able to adjust the time in the peak time domain and the 0 value time domain. Note that the domain A or the domain A' is preferably a domain including a point at which the absolute value of the peak is maximum. In addition, the domain B or the domain B' is preferably a domain including 0 point at which the output at the commercial frequency becomes 0 value.

An attribute is assigned to each of the domains divided as described above, and monitoring is performed by comparing output values in different attributes. For example, an average output value in each domain is checked, and monitoring is performed so as to compare the average output value of the domain of A with the average output value of the domain of B. In this way, it is possible to determine whether or not the output is caused by the arcing event. Instead of the average output value, an effective value may be used, or a median value may be used.

In the embodiment, in order to define each domain, the phase angle detection pulse is output from the phase division unit 14, and the output when the pulse is in the on or off state is detected by the determination unit 15. In this manner, it is preferable to output the phase angle detection pulse that is off in the peak time domain and on in the 0 value time domain, and the determination unit 15 detects the noise output in the on and off states of the phase angle detection pulse.

Figure 4:
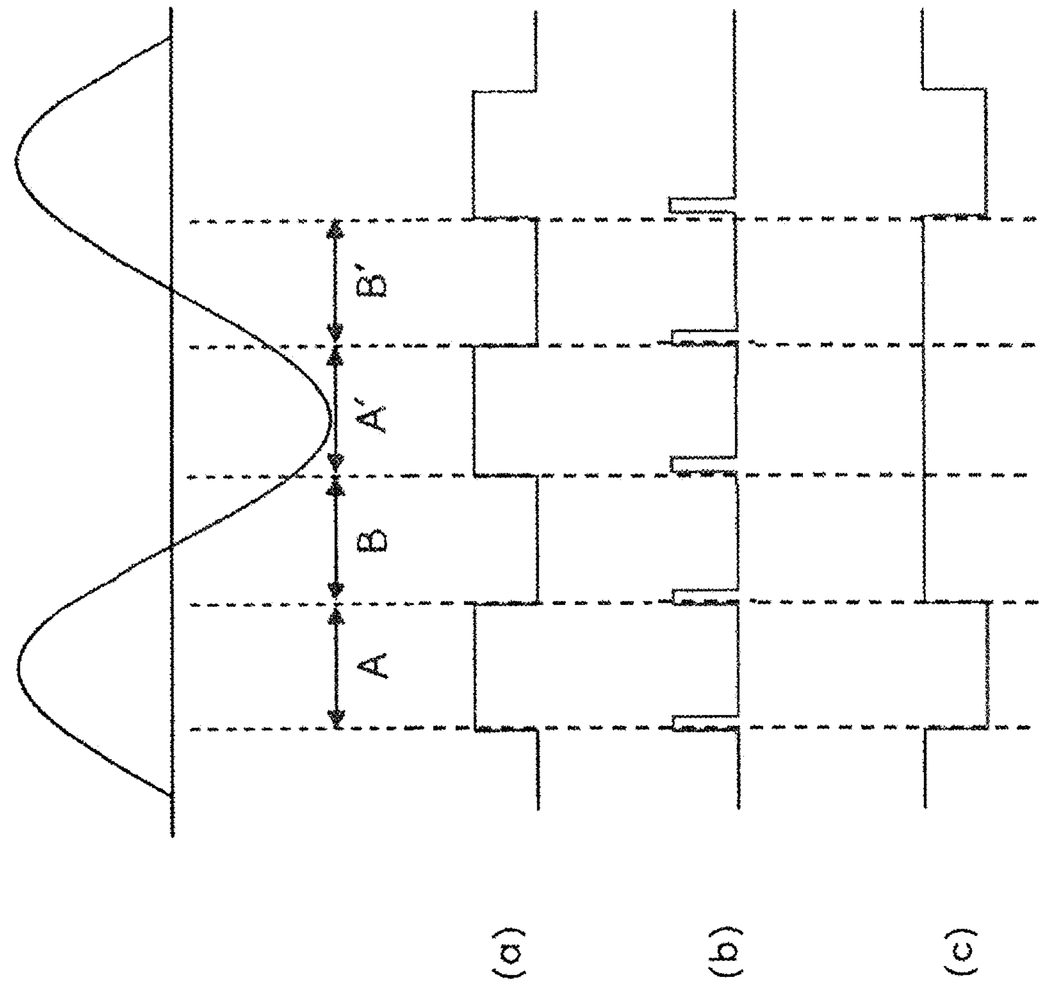
FIG. 4 is a diagram illustrating an example of another phase angle detection pulse.

Another example of using the phase angle detection pulse will be described with reference to FIG. 4. In FIG. 4(*a*), a phase angle detection pulse that is on in the peak time domain and off in the 0 value time domain is output. In FIG. 4(*b*), an instantaneous pulse is given to output an on/off state. In FIG. 4(*c*), a pulse is given in a domain other than the positive peak time domain, and shows how one period of the voltage waveform information is divided into four domains by calculation so that the positive peak time domain is from pulse detection to 4.2 ms, the zero value time domain is from 4.2 ms to 8.4 ms and 12.6 ms to 16.7 ms, and the negative peak time domain is from 8.4 ms to 12.6 ms. In any of the embodiments, the time or phase of the peak time domain and the 0 value time domain can be set for a smoothed output waveform or the like by providing the phase angle detection pulse.

Next, a more specific example will be described. In this example, the domain is defined so that one cycle is equally divided into four, and the domain of A is specified so that the phase angle is 45 degrees or more and less than 135 degrees, the domain of B is specified so that the phase angle is 135 degrees or more and less than 225 degrees, the domain of A' is specified so that the phase angle is 225 degrees or more and less than 315 degrees, and the domain of B' is specified so that the phase angle is 315 degrees or more and less than 405 degrees.

Figure 5:
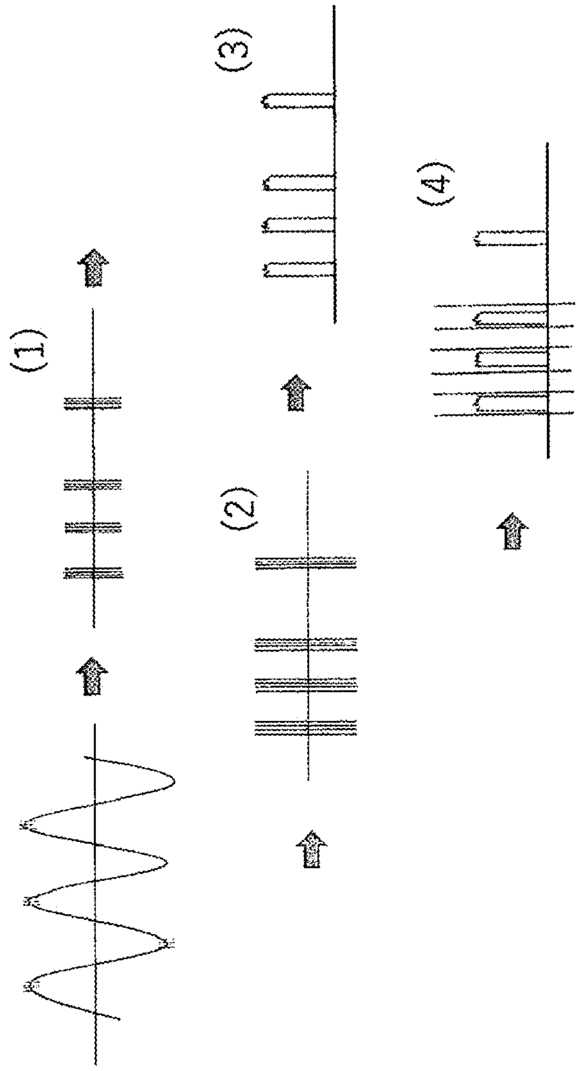
FIG. 5 is a diagram illustrating an example of a flow of processing from capturing a voltage waveform on which noise is superimposed to distinguishing an output for each domain. Here, (1) represents a result of extracting an output waveform in a high frequency band, (2) represents a result of amplification, (3) represents a result of processing by a smoothing unit, and (4) represents that an output at a timing of a peak time domain and an output at a timing of a 0 value time domain are distinguished.

As understood from FIGS. 1 and 5, in this example, steps of "(1) extracting high frequency noise by the filter unit 11", "(2) amplifying the high frequency noise by the amplification unit 12", "(3) smoothing each noise waveform group by the smoothing unit 13", and "(4) dividing one cycle into four on the time axis" are performed.

Next, determination is performed by the determination unit 15. In this example, in order to make a determination, the determination unit 15 performs calculation so that "the average value of the domain of B that is the 0 value time domain of the positive value" is subtracted from "the average value of the domain of A that is the peak time domain of the positive value". Note that the calculation may be performed so that "the average value of the domain of B' that is the 0 value time domain of the negative value" is subtracted from "the average value of the domain of A' that is the peak time domain of the negative value". In addition, both of them may be performed.

Figure 6:
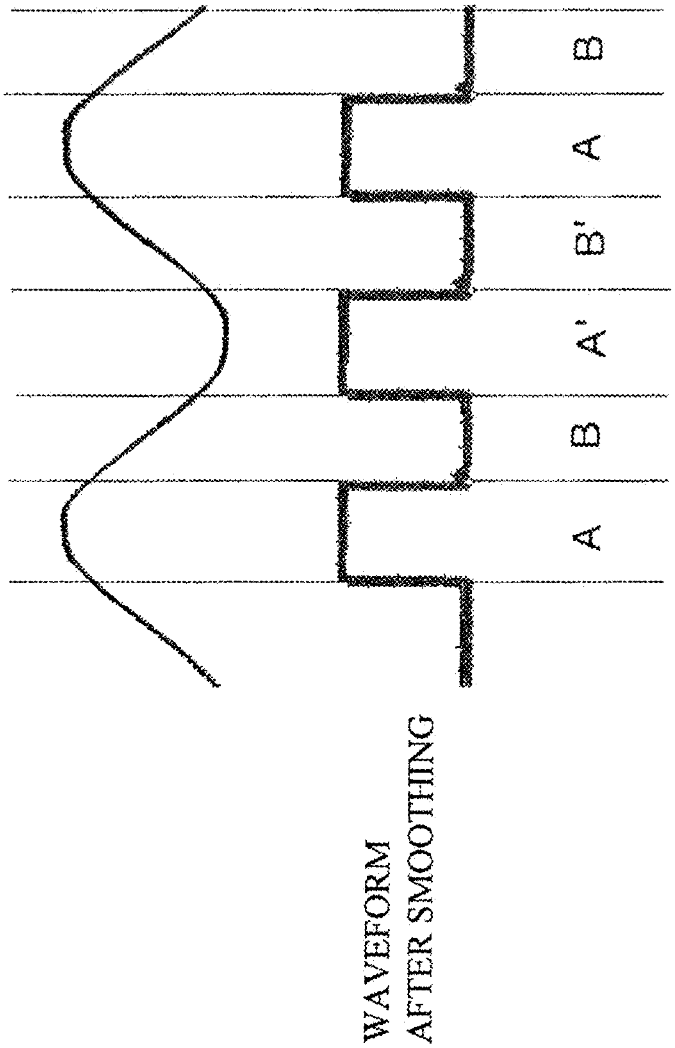
FIG. 6 is a diagram illustrating that a waveform after noise superimposed on a commercial frequency due to an arcing event is processed by the smoothing unit is compared with the commercial frequency, so that a timing at which noise occurs can be determined.

In the example illustrated in FIG. 6 in which the noise due to the arcing event is detected, information that is convex in the peak time domain and substantially zero in the 0 value time domain is obtained. When a calculation is performed so that "the average value of the domain of B that is the 0 value time domain of the positive value" is subtracted from "the average value of the domain of A that is the peak time domain of the positive value" in this information, the value is larger than the set threshold. Similarly, when a calculation is performed so that "the average value of the domain of B' that is the 0 value time domain of the negative value" is subtracted from "the average value of the domain of A' that is the peak time domain of the negative value", the value is larger than the set threshold. These calculated values are "the average value of the domain A-substantially 0", that is, "substantially the average value of the domain A". Note that the threshold set to an output level that can be determined as the arcing event may be arbitrarily set, but it is preferable to set a plurality of thresholds so that the threshold used for the determination can be selected according to the situation.

Figure 7:
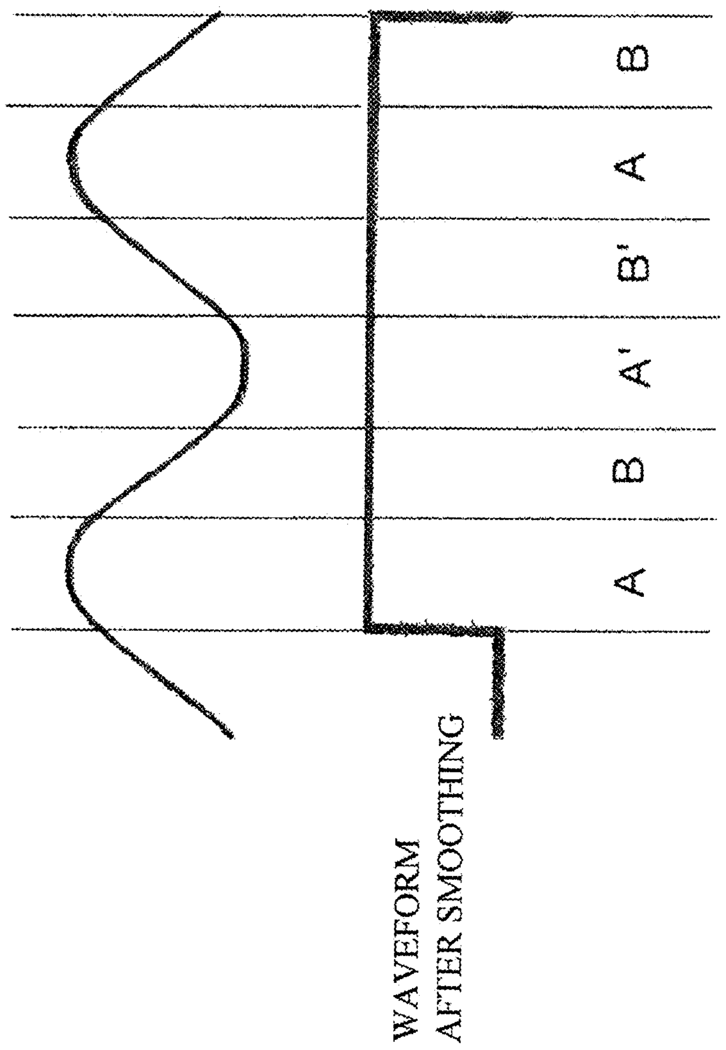
FIG. 7 is a diagram illustrating that a waveform after noise superimposed on a commercial frequency by use of a specific hand mixer, an electric drill, or the like is processed by the smoothing unit is compared with the commercial frequency, so that a timing at which noise occurs can be determined.

On the other hand, in a case where a specific device such as an electric drill is used, the detection result is as illustrated in FIG. 7, and when calculation is performed so that "the average value of the domain of B that is the 0 value time domain of the positive value" is subtracted from "the average value of the domain of A that is the peak time domain of the positive value", the value is smaller than the threshold. More specifically, "the average value of the domain A−the average value of the domain B" is "substantially 0". Similarly, when an operation is performed so that "the average value of the domain of B' that is the 0 value time domain of the negative value" is subtracted from "the average value of the domain of A' that is the peak time domain of the negative value", the value is smaller than the threshold. More specifically, "the average value of the domain A'−the average value of the domain B'" is "substantially 0".

As understood from this example, by setting a threshold to an appropriate value and determining whether or not a difference between the output at the timing in the peak time domain and the output at the timing in the 0 value time domain is equal to or larger than a predetermined threshold, it is possible to distinguish noise generated by use of a specific electric drill or the like from noise generated by an arcing event.

Figure 8:
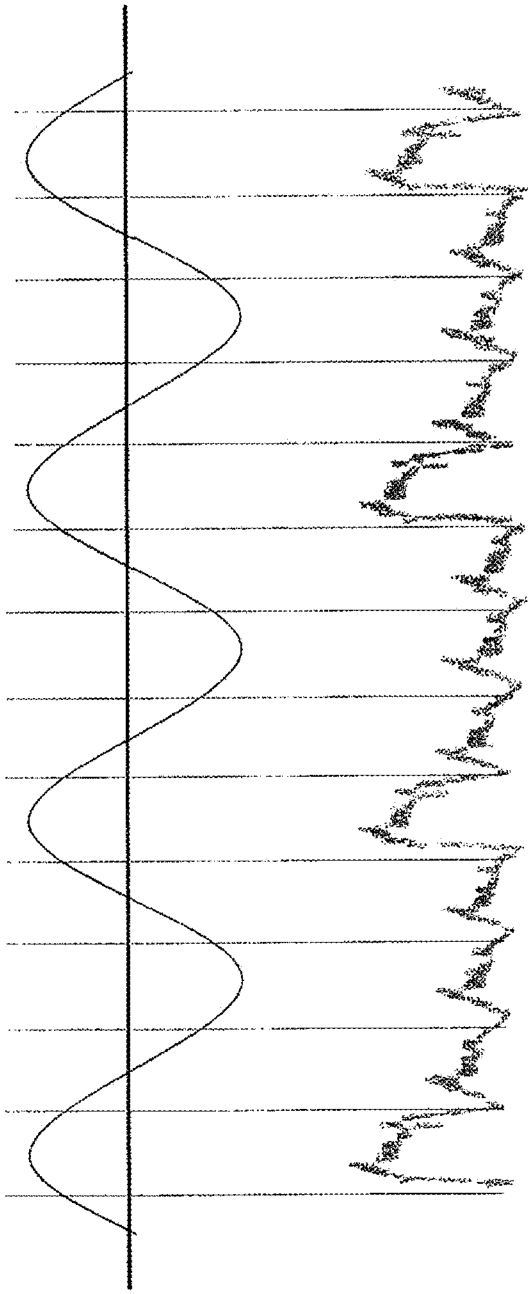
FIG. 8 is a diagram illustrating noise superimposed on the commercial frequency by use of a specific device different from that in FIG. 7.

Nevertheless, in a case where a specific electric device is used, there is a case where a behavior that noise caused by the use is large in the domain A and small in the domain B occurs (see FIG. 8). In that case, the calculation value representing the difference between the value of the domain A and the value of the domain B may exceed the first threshold. In this case, it is determined that an arcing event has occurred. In order to avoid such a determination, it is preferable to be able to determine whether or not it is an arcing event using the second threshold reset by the threshold changing unit 16.

If one high threshold is set originally, it may be possible to cope with detection of an arcing event. However, in this case, it is necessary to set the threshold high. Therefore, when a value considerably higher than a normal value but lower than the threshold is detected, it cannot be determined as an arcing event. This is not preferable in terms of risk management. Therefore, it is preferable that the threshold used to determine that the arcing event has occurred can be changed according to the situation.

The determination of the situation preferably focuses on matters that are not easily affected by the arcing event. For example, the determination unit 15 preferably monitors the output in the 0 value time domain. As a result of the monitoring, when the output in the 0 value time domain is not detected, the presence or absence of the arcing event may be determined using the first threshold. On the other hand, when the output in the 0 value time domain is detected, it is preferable that the threshold changing unit 16 uses the second threshold set higher than the first threshold as the threshold for determination, and performs the determination.

Here, an example in which the determination is performed while switching between the first threshold and the second threshold has been described, but the determination may be always performed using the second threshold depending on the situation. As the arcing detection system, it is preferable that any use method can be used, and an optimum method can be selected according to the use conditions and the like.

Note that, when the output in the 0 value time domain exceeds a certain value, it is a situation where whether the noise is caused by a device or an arcing event cannot be accurately determined. Therefore, it is preferable to set the third threshold so that the determination can be performed. When the output in the 0 value time domain exceeds the third threshold, it is desirable to perform alarm output or the like, such as notifying that the arcing event cannot be determined.

Furthermore, when there is an output exceeding the third threshold, it is preferable to lower sensitivity in the determination unit 15 and lower the output waveform. By reducing the amplification factor of the amplification unit 12 that amplifies the high frequency having passed through the filter unit 11, it is possible to determine the first threshold. In this case, the output waveform may be lowered to the third threshold or less.

Note that, when use of a specific device that outputs noise is finished, if the sensitivity is kept lowered, the detection range may be narrowed or noise associated with discharge may not be detected. Therefore, it is preferable that a fourth threshold is set, and after the third threshold is exceeded, the sensitivity is lowered so that the output waveform becomes less than or equal to the third threshold, and thereafter, when the output at the timing of the 0 value time domain is lower than the fourth threshold set to be lower than the third threshold, control is performed so as to return the set sensitivity to the original value.

By the way, normally, with respect to the noise of the arcing event and the level of the device noise, the noise level due to the arcing event is output higher (several times to several hundred times as the noise level), and even if the threshold for determining as the arcing event is increased from the first threshold to the second threshold, it is sufficiently possible to set the second threshold so that the arcing event can be determined.

The second threshold may be set by, for example, multiplying or adding an output value of the domain B or a specific value X by or to the first threshold. For example, the second threshold is determined as "first threshold+constant X", "first threshold×constant X", "first threshold+$B_{AVE}$", "first threshold+$B_{AVE}$×constant X", or "first threshold+($B_{AVE}$−constant X)". The specific value X may be a value determined in advance or may be determined from values of past measurement data. In addition, when the second threshold is simply multiplied by the output value of the domain B or the specific value X is added thereto, the level of the second threshold becomes high, and determination may not be made even if an arcing event occurs at a position away from the arcing detection unit 1. Therefore, it is possible to adjust the height of the second threshold by further multiplying or subtracting the specific value X with respect to the output value of the domain B or the specific value X. Note that the second threshold is preferably a value derived by adding or multiplying an output value in the 0 value time domain to or by the first threshold.

It is also preferable that the second threshold is set to a value derived by adding or multiplying the first threshold by a value derived by adding or multiplying to or by an output value in the 0 value time domain, or a value derived by further multiplying or subtracting a value derived by adding or multiplying an output value in the 0 value time domain to or by the first threshold.

In addition, it is also preferable that the second threshold is set to a value derived by adding or multiplying the first threshold by a value derived by adding or multiplying a specific value, or a value derived by further multiplying or subtracting a value derived by adding or multiplying the specific value to or by the first threshold.

For example, when the determination is made using the average value of the outputs in the domain A and the average value of the outputs in the domain B, the value of $A_{AVE}-B_{AVE}$ may be compared with the second threshold. Of course, it is not necessary to perform calculation using the average value, and for example, calculation may be performed using an effective value of output or the like.

In addition, the determination may be made by the value of the domain A instead of the difference between the domain A and the domain B. For example, the value of $A_{AVE}$ may be compared with the second threshold. Of course, it is not necessary to use an average value as a value to be compared with the second threshold, and for example, an effective value of output or the like may be used. Also in this case, the setting of the threshold may be changed from the first threshold to the second threshold and used. Even in that case, it is preferable to monitor the output of the domain B and the domain B'. When an abnormality is detected in the output of the domain B or the domain B', it is preferable to change the setting of the threshold from the first threshold to the second threshold.

In addition, it is preferable that the arcing event can be determined when the output value (detection value or calculation value) exceeding the second threshold continues a predetermined number of times or a predetermined time. It is possible to more accurately grasp whether the noise is the noise of the device or the noise of the arcing event by checking that the specific condition is continuously satisfied instead of determining only by the single waveform information.

As can be understood from these descriptions, in order to improve accuracy of determination, it is preferable to have a configuration in which the arcing event is determined when a state in which "the output at the timing in the peak time domain" or "the difference between the output at the timing in the peak time domain and the output at the timing in the 0 value time domain" is equal to or more than a threshold continues for a predetermined time. Of course, other means may be used. Note that, in order to enable such a configuration, in the arcing detection system of the embodiment, the calculation unit 18 continuously performs measurement of "the output at the timing in the peak time domain" or calculation of "the difference between the output at the timing in the peak time domain and the output at the timing in the 0 value time domain" for a predetermined time.

Note that it is preferable that the calculation unit 18 measures "the output at the timing in the peak time domain" or performs calculation to detect "the difference between the output at the timing in the peak time domain and the output at the timing in the 0 value time domain" of each path for a predetermined time, and adds or averages the calculation values of the measurement values or the difference for the predetermined time. If the determination unit 15 compares calculation results of respective paths obtained thereby and specifies the circuit of the arcing event, it is possible to cope with an abnormal situation such as a large noise suddenly generated.

Further, in a case where the arcing detection system includes a plurality of arcing detection units 1, the arcing detection units 1 may be formed in a plurality of circuits to be measured, and a path in which an arcing event is generated may be determined by adding or averaging detection values of differences between predetermined times obtained by dividing measurement data of the filter unit 11 of each arcing detection unit 1 by the phase division unit 14, and comparing the results. Note that the phase division unit 14 may be formed for each arcing detection unit 1, or the arcing detection system may have only one phase division units 14, which collects measurement data of all circuits, and divide the data at once. Further, the arcing detection system may include a plurality of phase division units 14 that can correspond to the plurality of arcing detection units 1.

Figure 10:
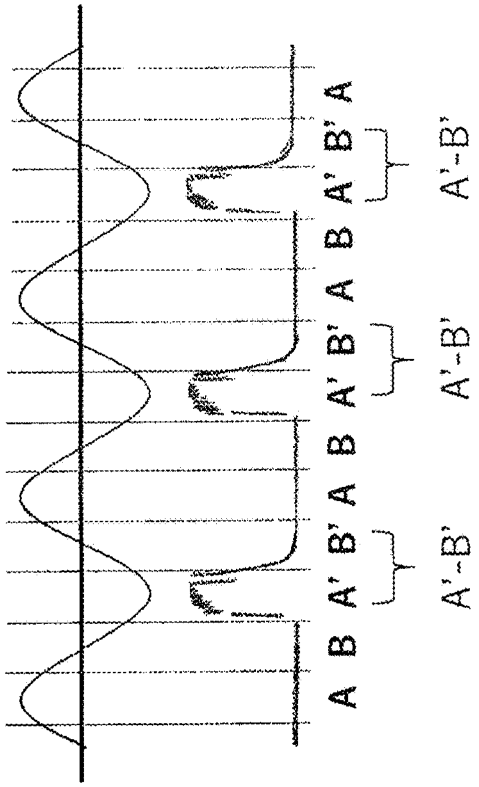
FIG. 10 is a diagram illustrating an example of using a difference between domains of negative values for determination.
Figure 9:
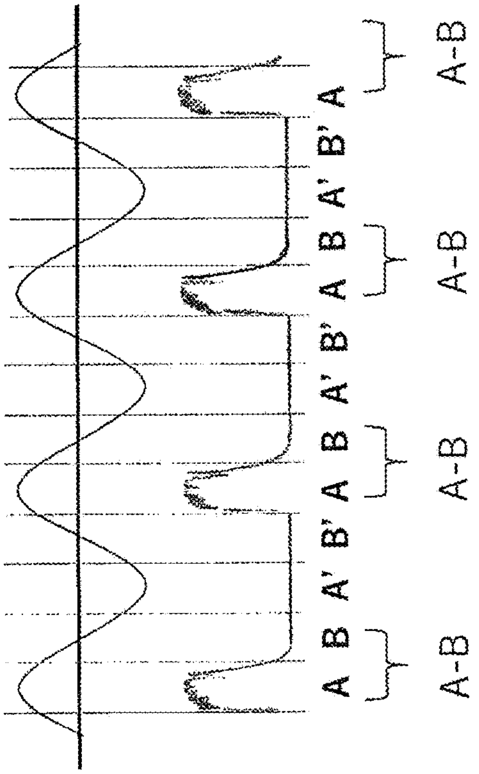
FIG. 9 is a diagram illustrating an example of using a difference between domains of positive values for determination.
Figure 11:
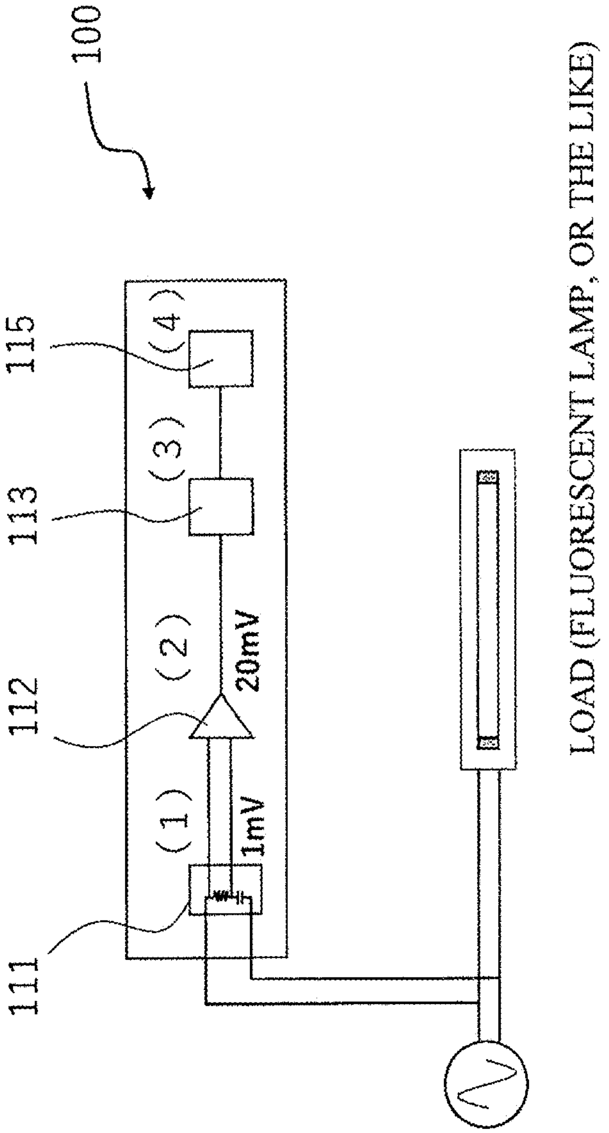
FIG. 11 is a diagram illustrating an example in which a conventional arcing detection unit is connected between a commercial power source and a load. Note that (1) to (4) represent portions where processes of (1) to (4) in FIGS. 12 and 13 are performed.
Figure 12:
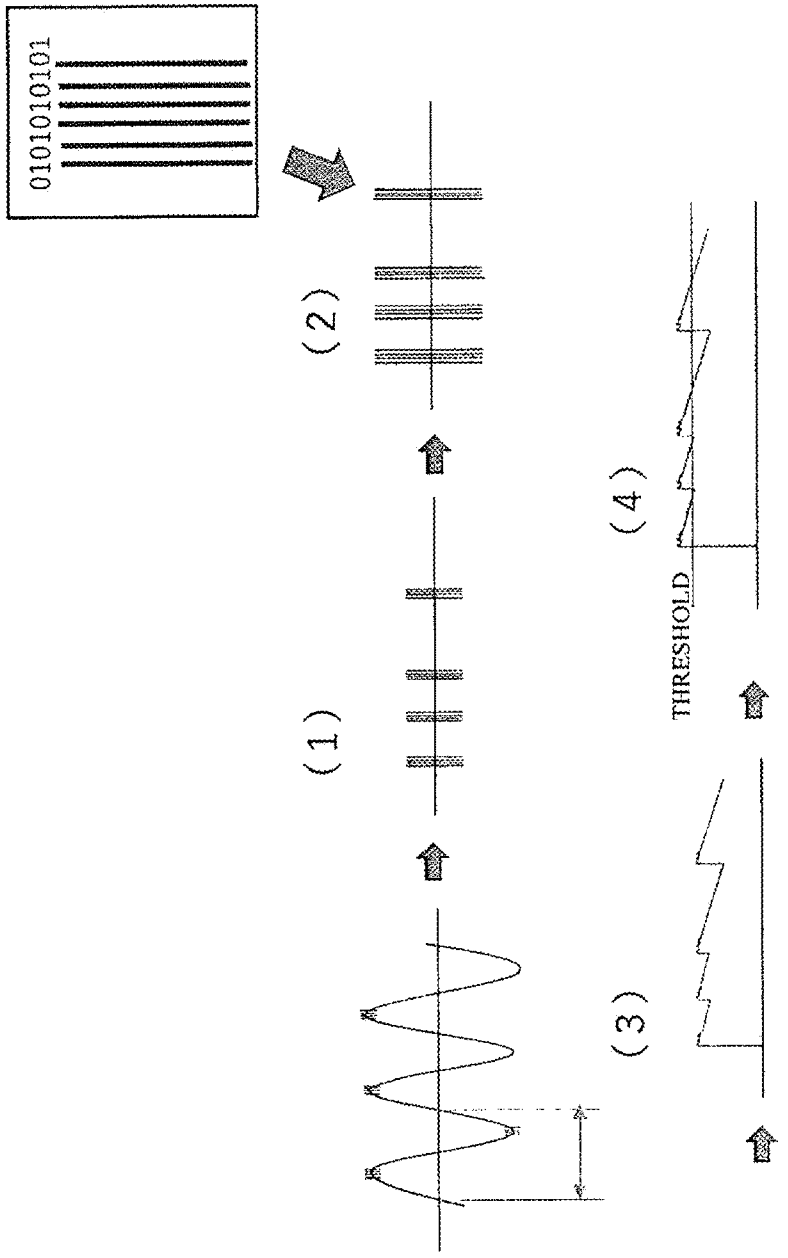
FIG. 12 is a diagram illustrating an example of a flow of processing from capturing a voltage waveform on which noise caused by occurrence of an arcing event is superimposed to comparing an output with a threshold using a conventional arcing detection unit. Here, (1) represents a result of extracting an output waveform in a high frequency band, (2) represents a result of amplification, (3) represents a result of processing by the smoothing unit, and (4) represents comparison between data obtained by smoothing an output and a threshold. Note that (2) also illustrates a partially enlarged view.
Figure 13:
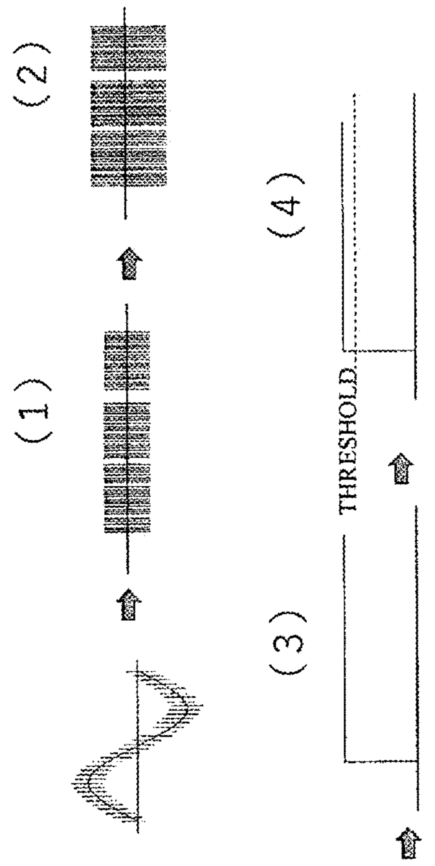
FIG. 13 is a diagram illustrating an example of a flow of processing from capturing a voltage waveform on which noise due to use of a specific device is superimposed to distinguishing an output for each domain using a conventional arcing detection unit. Note that (1) represents a result of extracting an output waveform in a high frequency band, (2) represents a result of amplification, (3) represents a result of processing by the smoothing unit, and (4) represents comparison between data obtained by smoothing an output and a threshold.

Note that both "the domain of A that is the peak time domain of the positive value" and "the domain of A' that is the peak time domain of the negative value" may be able to be used as determination elements, but only one of them may be used as determination elements. For example, "the domain of A that is the peak time domain of the positive value" can be made an element of determination, but "the domain of A' that is the peak time domain of the negative value" cannot be made an element of determination. Even in such a case, determination may be made using only elements that can be used as determination elements. For example, the determination is made using the value of the domain A that is the positive domain of the commercial frequency and the value of the domain B that is the domain following the domain A (see FIG. 9), or without using these values, the determination is made using the value of the domain A' that is the negative domain of the commercial frequency and the value of the domain B' that is the following domain (see FIG. 10).

The determination as to whether or not noise is caused by the device and the determination as to whether or not the arcing event occurs may be performed at one time, or may be performed at different timings.

If the determination as to whether or not noise is caused by the device and the determination as to whether or not the arcing event occurs are performed at different timings, the threshold used to estimate the cause of noise and the threshold used to determine whether or not to perform a specific output such as interruption of the breaker can be individually set. In order to enable such an operation, an output that is output from the determination unit 15 may be temporarily taken into the determination unit 15 again.

Although the present invention has been described by taking the embodiments as examples, the present invention is not limited to the above embodiments, and various aspects can be adopted. For example, it is also possible to detect not noise superimposed on a voltage but noise superimposed on a current.

REFERENCE SIGNS LIST

1 Box for housing electric device
8 Load

11 Filter unit
14 Phase division unit
15 Determination unit
16 Threshold changing unit
91 Commercial power source

The invention claimed is:

1. An arcing detection system that detects an output of noise superimposed on a voltage or a current of an electric circuit to which a load is connected, the arcing detection system comprising:

a filter unit that extracts an output waveform in a high frequency band;

a phase division unit that determines a peak time domain including domains before and after a peak at a commercial frequency related to the output waveform extracted by the filter unit and a 0 value time domain before and after an output at the commercial frequency becomes a 0 value to distinguish between the peak time domain and the 0 value time domain;

a determination unit that determines an arcing event when an output in the peak time domain or a calculation value of the output in the peak time domain and an output in a 0 value time domain exceeds a threshold; and a threshold changing unit that changes the threshold depending on presence or absence of an output in the 0 value time domain.

2. The arcing detection system according to claim 1, wherein the threshold changing unit sets a first threshold as a threshold for determining an arcing event when there is no output in the 0 value time domain, and sets a second threshold that is a value higher than the first threshold as a threshold for determining an arcing event when an output in the 0 value time domain is recognized.

3. The arcing detection system according to claim 2, wherein the second threshold is a value derived by adding or multiplying an output value in the 0 value time domain to or by the first threshold.

4. The arcing detection system according to claim 2, wherein the second threshold is set to a value derived by adding or multiplying the first threshold by a value derived by adding or multiplying to or by an output value in the 0 value time domain, or a value derived by further multiplying or subtracting a value derived by adding or multiplying an output value in the 0 value time domain to or by the first threshold.

5. The arcing detection system according to claim 2, wherein the second threshold is set to a value derived by adding or multiplying the first threshold by a value derived by adding or multiplying a specific value, or a value derived by further multiplying or subtracting a value derived by adding or multiplying the specific value to or by the first threshold.

6. The arcing detection system according to claim 2, wherein the arcing detection system is capable of determining an arcing event when an output value exceeding the second threshold continues a predetermined number of times or a predetermined time.

7. The arcing detection system according to claim 3, wherein the arcing detection system is capable of determining an arcing event when an output value exceeding the second threshold continues a predetermined number of times or a predetermined time.

8. The arcing detection system according to claim 4, wherein the arcing detection system is capable of determining an arcing event when an output value exceeding the second threshold continues a predetermined number of times or a predetermined time.

9. The arcing detection system according to claim 5, wherein the arcing detection system is capable of determining an arcing event when an output value exceeding the second threshold continues a predetermined number of times or a predetermined time.

* * * * *